(12) United States Patent
Tokuda et al.

(10) Patent No.: US 12,051,843 B2
(45) Date of Patent: Jul. 30, 2024

(54) DIRECTIONAL COUPLER

(71) Applicant: Murata Manufacturing Co., Ltd., Kyoto (JP)

(72) Inventors: Daisuke Tokuda, Kyoto (JP); Katsuya Shimizu, Kyoto (JP); Kenta Seki, Kyoto (JP); Ryangsu Kim, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 501 days.

(21) Appl. No.: 17/331,080

(22) Filed: May 26, 2021

(65) Prior Publication Data

US 2021/0376441 A1     Dec. 2, 2021

(30) Foreign Application Priority Data

May 29, 2020   (JP) .................................. 2020-094470

(51) Int. Cl.
*H01P 5/18*     (2006.01)
(52) U.S. Cl.
CPC ..................................... *H01P 5/18* (2013.01)
(58) Field of Classification Search
CPC .......... H03H 7/0123; H03H 7/06; H03H 7/40; H03H 7/48; H01P 5/18
See application file for complete search history.

(56) References Cited

U.S. PATENT DOCUMENTS

| | | | |
|---|---|---|---|
| 9,240,766 B2 * | 1/2016 | Laporte | H03F 3/24 |
| 9,866,244 B2 * | 1/2018 | Srirattana | H04B 1/0057 |
| 9,954,564 B2 * | 4/2018 | Little | H04B 1/401 |
| 10,276,911 B2 * | 4/2019 | Noguchi | H01P 1/24 |
| 2020/0076045 A1 | 3/2020 | Seki et al. | |
| 2021/0013858 A1 | 1/2021 | Tokuda et al. | |

FOREIGN PATENT DOCUMENTS

| | | |
|---|---|---|
| CN | 110875509 A | 3/2020 |
| WO | 2019/189232 A1 | 10/2019 |

* cited by examiner

*Primary Examiner* — Andrea Lindgren Baltzell
*Assistant Examiner* — Kimberly E Glenn
(74) *Attorney, Agent, or Firm* — Pearne & Gordon LLP

(57) ABSTRACT

A directional coupler includes a main line, a sub-line electromagnetically coupled with the main line, a coupled output terminal, plural filters, filter switching circuits, and plural filter protecting switches. Each of the filter switching circuits is able to connect a corresponding one of the plural filters to one end of the sub-line and to the coupled output terminal. Each of the filter protecting switches is directly connected to a corresponding end of a corresponding one of the plural filters and is able to switch between a connection state and a disconnection state. The connection state is a state in which the corresponding end of the corresponding one of the plural filters is connected to a reference potential. The disconnection state is a state in which the corresponding end of the corresponding one of the plural filters is disconnected from the reference potential.

19 Claims, 5 Drawing Sheets

DIRECTIONAL COUPLER

CROSS REFERENCE TO RELATED APPLICATION

This application claims priority from Japanese Patent Application No. 2020-094470 filed on May 29, 2020. The content of this application is incorporated herein by reference in its entirety.

BACKGROUND OF THE DISCLOSURE

Field of the Disclosure

The present disclosure relates to a directional coupler.

Description of the Related Art

International Publication No. 2019/189232 discloses a directional coupler including a main line and a sub-line. A variable filter circuit including plural filters is connected between the sub-line of the directional coupler and a coupling port.

BRIEF SUMMARY OF THE DISCLOSURE

As a filter, a small, high-performance filter formed by thin-film micromachining may be used. Such a filter is however vulnerable to electrostatic discharge destruction. If electrostatic discharge destruction occurs in a filter, the frequency characteristics of the filter are decreased, which may fail to output a desired signal.

Accordingly, it is an object of the present disclosure to provide a directional coupler that can make it less likely to decrease the frequency characteristics of a filter.

According to an aspect of the present disclosure, there is provided a directional coupler including a main line, a sub-line electromagnetically coupled with the main line, an output terminal, plural filters, a switch circuit, and plural switches. The switch circuit is able to connect each of the plural filters to one end of the sub-line and to the output terminal. The plural switches are each directly connected to a corresponding end of a corresponding one of the plural filters and are each able to switch between a connection state and a disconnection state. The connection state is a state in which the corresponding end of the corresponding one of the plural filters is connected to a reference potential. The disconnection state is a state in which the corresponding end of the corresponding one of the plural filters is disconnected from the reference potential.

According to another aspect of the present disclosure, there is provided a directional coupler including a main line, a sub-line electromagnetically coupled with the main line, an output terminal, plural filters, a first switch circuit, and plural second switch circuits. The first switch circuit is able to connect each of the plural filters to one end of the sub-line and to the output terminal. The second switch circuits are each connected to a corresponding end of a corresponding one of the plural filters and are each able to switch between a connection state and a disconnection state. The connection state is a state in which the corresponding end of the corresponding one of the plural filters is connected to a reference potential. The disconnection state is a state in which the corresponding end of the corresponding one of the plural filters is disconnected from the reference potential. When the first switch circuit connects a selected one of the plural filters to one end of the sub-line and to the output terminal, the plural second switch circuits are each operable to disconnect a corresponding end of the selected filter from the reference potential and to connect a corresponding end of a filter other than the selected filter to the reference potential.

According to an aspect of the present disclosure, it is possible to make it less likely to decrease the frequency characteristics of a filter. Other features, elements, characteristics, and advantages of the present disclosure will become more apparent from the following detailed description of preferred embodiments of the present disclosure with reference to the attached drawings.

DETAILED DESCRIPTION OF THE DISCLOSURE

Figure 1:
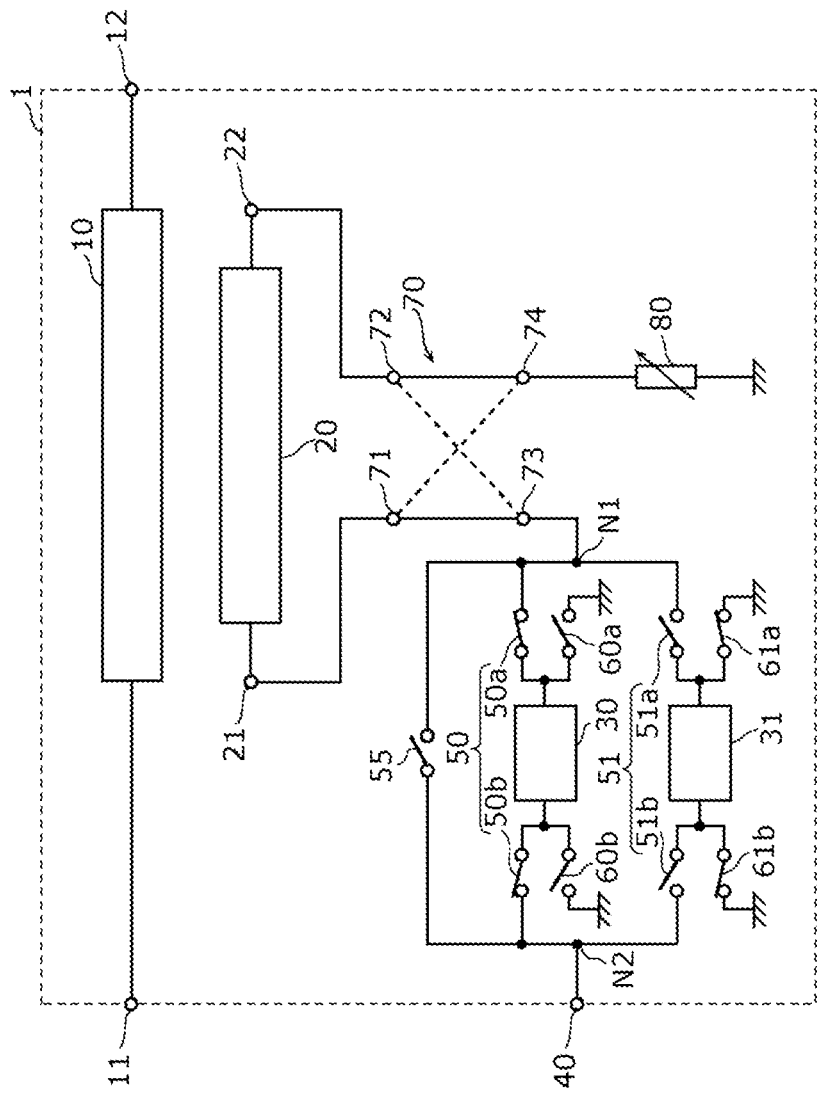
FIG. 1 illustrates the configuration of a directional coupler according to a first embodiment.

Directional couplers according to embodiments of the disclosure will be described below in detail with reference to the accompanying drawings. The embodiments described below illustrate specific examples. The numeric values, configurations, materials, elements, positions and connection states of the elements, steps, and the order of steps illustrated in the following embodiments are only examples and are not described for limiting the disclosure. Among the elements illustrated in the following embodiments, the elements that are not recited in the independent claims will be described as optional elements.

In the drawings, the elements are only schematically, not necessarily precisely, illustrated. For example, the reduced scales in the individual drawings do not necessarily match each other. In the individual drawings, elements having the substantially same configuration are designated by like reference numeral and an explanation thereof will be simplified or not be repeated.

In the specification, terms representing the relationships between elements, such as "being the same" and "being equal", and the ranges of numeric values are not strictly restricted to those described in the specification and include equivalent terms and ranges. For example, a certain range of numeric values includes about several percentage of difference from these values.

In a description of circuit configurations, "A is directly connected to B" means that A is directly connected to B using a connecting terminal and/or a wiring conductor without another circuit device interposed between A and B. "A is connected to B" includes, not only the meaning that A is directly connected to B using a connecting terminal and/or a wiring conductor, but also the meaning that A is electrically connected to B via another circuit device. "Being connected between A and B" means that "being connected to both A and B between A and B".

First Embodiment

1-1. Configuration

The configuration of a directional coupler 1 according to a first embodiment will first be described below with reference to FIG. 1.

As shown in FIG. 1, the directional coupler 1 includes a main line 10, a sub-line 20, plural filters (two filters 30 and 31 in the example in FIG. 1), a coupled output terminal 40, plural filter switching circuits (two filter switching circuits 50 and 51 in the example in FIG. 1), a bypass switch 55, plural filter protecting switches (four filter protecting switches 60a, 60b, 61a, and 61b in the example in FIG. 1), a direction switching circuit 70, and a termination circuit 80. The main line 10 and the sub-line 20 are electromagnetically coupled with each other.

In the first embodiment, the directional coupler 1 includes a semiconductor integrated circuit (IC) and one or more external devices connected to the semiconductor IC. The main line 10, the sub-line 20, the filter switching circuits 50 and 51, and the filter protecting switches 60a, 60b, 61a, and 61b are formed in or on the semiconductor IC. The filters 30 and 31 are constituted by one or more external devices. That is, the filters 30 and 31 are disposed outside the semiconductor IC. The coupled output terminal 40, the bypass switch 55, the direction switching circuit 70, and the termination circuit 80 may also be formed in or on the semiconductor IC. All the devices other than the filters 30 and 31 may be formed in or on the semiconductor IC. For example, the semiconductor IC and one or more chips including the filters 30 and 31 are disposed on a module substrate (not shown).

The main line 10 has two input/output terminals 11 and 12. The input/output terminal 11 is connected to at least one of a transmit circuit and a receive circuit. The transmit circuit generates a transmit radio-frequency (RF) signal. The receive circuit processes an RF signal received by an antenna (not shown). The input/output terminal 12 is connected to the antenna. The input/output terminal 11 may be connected to the antenna, while the input/output terminal 12 may be connected to the transmit circuit or the receive circuit.

The sub-line 20 has two ends 21 and 22. The end 21 can be connected to the coupled output terminal 40 via one of the filters 30 and 31. More specifically, the end 21 can be connected to the filter 30 via the direction switching circuit 70 and the filter switching circuit 50, while the end 21 can be connected to the filter 31 via the direction switching circuit 70 and the filter switching circuit 51. The end 22 can be connected to the termination circuit 80 via the direction switching circuit 70. Each of the ends 21 and 22 is selectively connected to one of the coupled output terminal 40 and the termination circuit 80 via the direction switching circuit 70.

The filters 30 and 31 are connected between the end 21 of the sub-line 20 and the coupled output terminal 40. The filters 30 and 31 are each connected to node N1 and node N2 and are connected in parallel with each other.

Both of nodes N1 and N2 are branching points leading to multiple paths which each pass through one of the filters 30 and 31. Node N1 is a common node connected to both of the filters 30 and 31 and is connected to the end 21 of the sub-line 20 via the direction switching circuit 70. Node N2 is a common node connected to both of the filters 30 and 31 and is connected to the coupled output terminal 40.

In the first embodiment, the number of paths disposed between node N1 and node N2 is greater than that of filters by one. More specifically, in the example in FIG. 1, one path passing through the filter 30, one path passing through the filter 31, and one bypass path passing through the bypass switch 55, that is, a total of three paths, are disposed between node N1 and node N2. If the bypass switch 55 is omitted, the same number of paths as that of filters are disposed between node N1 and node N2.

The pass band of the filter 30 and that of the filter 31 are different from each other. The filters 30 and 31 are each one of a low pass filter, a high pass filter, a band pass filter, and a band elimination filter. The filters 30 and 31 are each an LC filter including a capacitor and an inductor. At least one of the filters 30 and 31 may alternatively be an acoustic wave filter, such as a surface acoustic wave (SAW) filter or a bulk acoustic wave (BAW) filter. At least one of the filters 30 and 31 may alternatively be a filter formed in an integrated passive device (IPD). A filter included in an IPD is formed by thin-film micromachining and is thus vulnerable to electrostatic discharge destruction. Even a thick-film filter is vulnerable to electrostatic discharge destruction if it has an electrode made by micromachining.

Impedance of each of the filters 30 and 31 seen from node N1 may have positive reactance. Impedance of each of the filters 30 and 31 seen from node N2 may have positive reactance.

The coupled output terminal 40 can be connected to the filter 30 via the filter switching circuit 50, while the coupled output terminal 40 can be connected to the filter 31 via the filter switching circuit 51. Part of a signal passing through the main line 10 is transmitted to the sub-line 20 due to electromagnetic coupling between the main line 10 and the sub-line 20 and is then outputted from the coupled output terminal 40 via one of the filters 30 and 31 or the bypass switch 55.

The filter switching circuits 50 and 51 form a first switch circuit that can connect each of the filters 30 and 31 to the end 21 of the sub-line 20 and to the coupled output terminal 40. The filter switching circuits 50 and 51 are respectively disposed in association with the filters 30 and 31 based on a one-on-one correspondence. More specifically, the filter switching circuit 50 is disposed between node N1 and node N2 in series with the filter 30 on the same path on which the filter 30 is disposed. The filter switching circuit 51 is disposed between node N1 and node N2 in series with the filter 31 on the same path on which the filter 31 is disposed.

The filter switching circuit 50 includes switches 50a and 50b. The switch 50a is connected to node N1 and to one end of the filter 30. The switch 50b is connected to node N2 and to the other end of the filter 30. Each of the switches 50a and 50b can be switched between ON/OFF states. The ON/OFF states of the switches 50a and 50b are controlled so that both of the switches 50a and 50b are either in the ON state together or in the OFF state together. The filter switching circuit 50 may include only one of the switches 50a and 50b.

If a switch is in the ON state, it is in a conducting state in which both ends of the switch are electrically connected or a short state in which a path passing through the switch is short-circuited. If a switch is in the OFF state, it is in a non-conducting state in which neither end of the switch is electrically connected or an open state in which a path passing through the switch is open.

The filter switching circuit 51 includes switches 51a and 51b. The switch 51a is connected to node N1 and to one end of the filter 31. The switch 51b is connected to node N2 and to the other end of the filter 31. Each of the switches 51a and 51b can be switched between ON/OFF states. The ON/OFF states of the switches 51a and 51b are controlled so that both of the switches 51a and 51b are either in the ON state together or in the OFF state together. The filter switching circuit 51 may include only one of the switches 51a and 51b.

The bypass switch 55 connects a bypass path between node N1 and node N2 or disconnects the bypass path. The bypass path is a path on which neither of the filters 30 and 31 is disposed, unlike the other paths connecting node N1 and node N2. When the bypass switch 55 is ON, a signal transmitted from the main line 10 to the sub-line 20 due to electromagnetic coupling therebetween (hereinafter such a signal will be called a coupled signal) passes through the bypass path and is outputted from the coupled output terminal 40. When one of the filters 30 and 31 is connected to node N1 and node N2 by the filter switching circuit 50 or 51, the bypass switch 55 is OFF.

Each of the filter protecting switches 60a, 60b, 61a, and 61b is an example of a second switch circuit. The filter protecting switch 60a is connected to one end of the filter 30 and to a reference potential. The filter protecting switch 60b is connected to the other end of the filter 30 and to the reference potential. The filter protecting switch 61a is connected to one end of the filter 31 and to the reference potential. The filter protecting switch 61b is connected to the other end of the filter 31 and to the reference potential. Each of the filter protecting switches 60a and 60b can switch between a state in which a corresponding end of the filter 30 is connected to the reference potential and a state in which the corresponding end of the filter 30 is disconnected from the reference potential. Each of the filter protecting switches 61a and 61b can switch between a state in which a corresponding end of the filter 31 is connected to the reference potential and a state in which the corresponding end of the filter 31 is disconnected from the reference potential. The reference potential is 0 V (ground), for example, but is not limited to this value. The reference potential may be a positive or negative constant potential. Plural reference potentials having different values may be provided.

The filter protecting switch 60a is directly connected to the end of the filter 30 closer to node N1 and to a ground. The filter protecting switch 60a switches between a state in which this end of the filter 30 is connected to the ground and a state in which this end of the filter 30 is disconnected from the ground.

The filter protecting switch 60b is directly connected to the end of the filter 30 closer to node N2 and to a ground. The filter protecting switch 60b can switch between a state in which this end of the filter 30 is connected to the ground and a state in which this end of the filter 30 is disconnected from the ground.

The filter protecting switch 61a is directly connected to the end of the filter 31 closer to node N1 and to a ground. The filter protecting switch 61a can switch between a state in which this end of the filter 31 is connected to the ground and a state in which this end of the filter 31 is disconnected from the ground.

The filter protecting switch 61b is directly connected to the end of the filter 31 closer to node N2 and to a ground. The filter protecting switch 61b can switch between a state in which this end of the filter 31 is connected to the ground and a state in which this end of the filter 31 is disconnected from the ground.

The switches 50a, 50b, 51a, and 51b, the bypass switch 55, and the filter protecting switches 60a, 60b, 61a, and 61b are all switching devices, such as metal oxide semiconductor field effect transistors (MOSFETs). Instead of MOSFETs, bipolar transistors may be used. Other switches, which will be described below, are also such a switching device, such as a MOSFET or a bipolar transistor.

The direction switching circuit 70 is connected between the sub-line 20 and the filters 30 and 31. The direction switching circuit 70 is also connected between the sub-line 20 and the termination circuit 80.

More specifically, the direction switching circuit 70 has four terminals 71 through 74. The terminal 71 is connected to the end 21 of the sub-line 20. The terminal 72 is connected to the end 22 of the sub-line 20. The terminal 73 is connected to node N1. The terminal 74 is connected to the termination circuit 80.

The direction switching circuit 70 switches between first and second connection states. In the first connection state, the end 21 of the sub-line 20 is connected to node N1, and the end 22 of the sub-line 20 is connected to the termination circuit 80. In the second connection state, the end 21 of the sub-line 20 is connected to the termination circuit 80, and the end 22 of the sub-line 20 is connected to node N1. The first connection state is a state in which the terminals 71 and 73 are electrically connected to each other, while the terminals 72 and 74 are electrically connected to each other, as indicated by the solid lines in FIG. 1. The second connection state is a state in which the terminals 71 and 74 are electrically connected to each other, while the terminals 72 and 73 are electrically connected to each other, as indicated by the broken lines in FIG. 1. A switching device, such as a MOSFET, is used for switching between the first and second connection states of the terminals 71 through 74 of the direction switching circuit 70.

As a result of the direction switching circuit 70 switching between the first and second connection states, the end 21 or the end 22 of the sub-line 20 can be selectively connected to the coupled output terminal 40. This implements two-way signal detection. For example, not only a signal of traveling waves transmitted through the main line 10, but also a signal of reflected waves can be detected.

The termination circuit 80 is connected to the end 22 of the sub-line 20. The termination circuit 80 is a circuit whose impedance can be changed.

Figure 2:
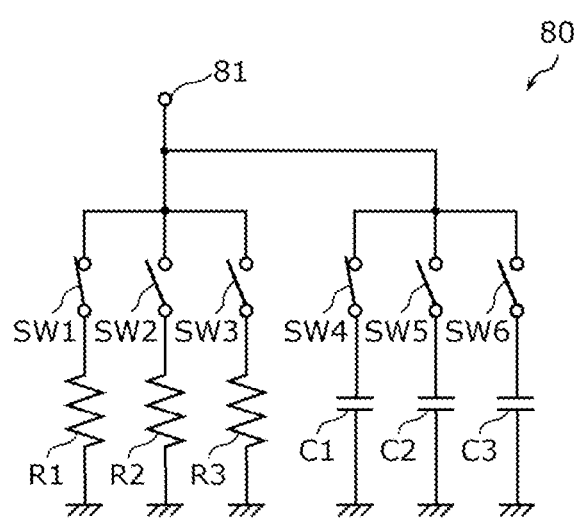
FIG. 2 is a circuit diagram illustrating an example of a variable termination circuit of the directional coupler according to the first embodiment.

FIG. 2 is a circuit diagram illustrating an example of the termination circuit 80 of the directional coupler 1 according to the first embodiment. As shown in FIG. 2, the termination circuit 80 includes three resistors R1 through R3, three capacitors C1 through C3, six switches SW1 through SW6, and a terminal 81.

The terminal 81 is connected to the end 22 of the sub-line 20. In the first embodiment, the terminal 81 is connected to the end 22 of the sub-line 20 via the direction switching circuit 70.

The resistors R1 through R3 and the capacitors C1 through C3 are connected in series with the six switches SW1 through SW6, respectively. A series circuit of a resistor and its associated switch and a series circuit of a capacitor and its associated switch are connected in parallel with each other between the terminal 81 and a ground.

The resistance values of the resistors R1 through R3 may be the same or different from each other. The capacitance values of the capacitors C1 through C3 may be the same or different from each other. A switch may not be connected to one of the three resistors R1 through R3. A switch may not be connected to one of the three capacitors C1 through C3.

The switches SW1 through SW6 are switching devices, such as MOSFETs. The switches SW1 through SW6 are switched between ON and OFF so that the impedance of the termination circuit 80 can be changed. For example, the switching states of the switches SW1 through SW6 are adjusted based on the fundamental frequency of an RF signal transmitted through the main line 10. More specifically, the ON/OFF states of the switches SW1 through SW6 are controlled so that the impedance of the termination circuit 80 is adjusted to be a suitable value that allows a signal having a fundamental frequency to be sufficiently absorbed and consumed by the termination circuit 80.

The termination circuit 80 may include one or more inductors. The circuit configuration of the termination circuit 80 is not limited to a particular configuration. Resistors or capacitors may not necessarily be included in the termination circuit 80.

The directional coupler 1 configured as described above is used for detecting an RF signal transmitted through the main line 10. RF signals are compliant with a certain communication standard, such as Wi-Fi (registered trademark), Long Term Evolution (LTE), or 5th generation (5G). The directional coupler 1 is disposed in a front-end portion of a multimode-/multiband-support cellular phone, for example.

Part of an RF signal transmitted through the main line 10 is outputted from the coupled output terminal 40 via the sub-line 20 and via one of the filters 30 and 31 or the bypass switch 55. A detector (not shown), for example, is connected to the coupled output terminal 40. The detector detects the power of an input signal, for example, and outputs the detection result.

The detection result is outputted to the transmit circuit, the receive circuit, or a control circuit that controls the transmit circuit and the receive circuit. Based on the detection result, processing related to signal transmission or reception can be controlled appropriately; for example, the amplification factor of an amplifier of the transmit circuit or the receive circuit can be adjusted to a suitable value. Enhancing the detection accuracy in this manner can improve the precision and reliability of various control operations.

At least one of the direction switching circuit 70 and the bypass switch 55 may be omitted in the directional coupler 1. The termination circuit 80 may not necessarily be a variable termination circuit and may be a termination circuit with fixed impedance.

Three or more filters may be disposed between node N1 and node N2. In this case, filter switching circuits and filter protecting switches may be provided in accordance with the number of filters.

1-2. Operation (ON/OFF States of Switches)

The operation of the directional coupler 1 according to the first embodiment will now be described below. In the following description, the ON/OFF states of the switches will mainly be discussed. The ON/OFF states of the switches are switched by a control circuit, which is not shown.

In the directional coupler 1, part of an RF signal transmitted through the main line 10 flows into the sub-line 20 as a coupled signal due to electromagnetic coupling between the main line 10 and the sub-line 20. The coupled signal flows from one of the ends 21 and 22 of the sub-line 20 until node N1 via the direction switching circuit 70. The coupled signal having reached node N1 then passes through a selected one of the filters 30 and 31 or the bypass switch 55 and further through node N2 and is outputted from the coupled output terminal 40.

To transmit the coupled signal from node N1 to node N2 in this manner, the filter switching circuits 50 and 51 and the bypass switch 55 are controlled so that only one path connects node N1 and node N2 or that no path connects node N1 and node N2. That is, the filter switching circuits 50 and 51 and the bypass switch 55 are controlled so that only one of or neither of the filters 30 and 31 disposed between node N1 and node N2 is selected.

Hereinafter, a filter connected between node N1 and node N2 by the filter switching circuit 50 or 51 will be called a selected filter. A filter other than the selected filter will be called an unselected filter. The selected filter is a filter through which a coupled signal is transmitted.

In the example in FIG. 1, the filter switching circuit 50 is ON and the filter 30 is thus a selected filter. The filter 31 is an unselected filter, and the filter switching circuit 51 and the bypass switch 55 are thus both OFF.

When the bypass switch 55 is ON, the filter switching circuits 50 and 51 are both OFF. In this case, the filters 30 and 31 are both unselected filters. All of the filter switching circuits 50 and 51 and the bypass switch 55 may be OFF.

In the first embodiment, the filter protecting switches 60a, 60b, 61a, and 61b are controlled so that they are switched in accordance with the ON/OFF states of the filter switching circuits 50 and 51. More specifically, the filter protecting switches 60a, 60b, 61a, and 61b are each operable to disconnect a corresponding end of a selected filter from a reference potential and to connect a corresponding end of an unselected filter to the reference potential.

In the example in FIG. 1, the filter protecting switches 60a and 60b connected to the corresponding ends of the filter 30, which is a selected filter, are OFF. That is, the filter protecting switches 60a and 60b disconnect the corresponding ends of the filter 30 from a ground. This allows a coupled signal, which is transmitted from the main line 10 to the sub-line 20 due to electromagnetic coupling therebetween, to pass from node N1 to node N2 via the filter 30.

In contrast, the filter protecting switches 61a and 61b connected to the corresponding ends of the filter 31, which is an unselected filter, are ON. That is, the filter protecting switches 61a and 61b connect the corresponding ends of the filter 31 to a ground.

The potentials at both ends of the filter 31, which is an unselected filter through which a coupled signal does not flow, are fixed in this manner. This makes it less likely to generate a large potential difference across the filter 31 and can accordingly reduce the occurrence of electrostatic discharge destruction in the filter 31.

The potential at only one end of an unselected filter may be fixed. For example, the filter protecting switch 61a may only be ON so that the end of the filter 31 closer to node N1 is connected to a ground. Alternatively, the filter protecting switch 61b may only be ON so that the end of the filter 31 closer to node N2 is connected to a ground. This can still reduce the occurrence of electrostatic discharge destruction in the filter 31, compared with when the potentials at both ends of the filter 31 are unstable.

If the potential only at one end of an unselected filter is fixed in this manner, a filter protecting switch may be provided only at one end of a filter. This may omit the provision of one of the filter protecting switches 60a and 60b and one of the filter protecting switches 61a and 61b.

1-3. Advantages and Others

As described above, the directional coupler 1 according to the first embodiment includes the main line 10, the sub-line 20 electromagnetically coupled with the main line 10, the coupled output terminal 40, the plural filters 30 and 31, the filter switching circuits 50 and 51, and the plural filter protecting switches 60a, 60b, 61a, and 61b. The filter switching circuits 50 and 51 can connect the filters 30 and 31, respectively, to the end 21 of the sub-line 20 and to the coupled output terminal 40. The filter protecting switches 60a, 60b, 61a, and 61b are each directly connected to a corresponding end of the filter 30 or 31 and can switch between a state in which the corresponding end of the associated filter 30 or 31 is connected to a reference potential and a state in which the corresponding end of the associated filter 30 or 31 is disconnected from the reference potential.

For example, when one of the filter switching circuits 50 and 51 connects a selected one of the filters 30 and 31 to the end 21 of the sub-line 20 and to the coupled output terminal 40, the filter protecting switches 60a, 60b, 61a, and 61b are each operable to disconnect a corresponding end of the selected filter from a reference potential and to connect a corresponding end of a filter other than the selected filter to the reference potential.

This can fix the potential at least at one end of an unselected filter to a reference potential, which reduces the occurrence of electrostatic discharge destruction in the unselected filter, thereby making it less likely to decrease the frequency characteristics of the filter.

Since the potential at least at one end of an unselected filter is fixed, the unselected filter is less likely to adversely influence the bandpass characteristics of a selected filter. This can enhance the precision of a signal extracted from the coupled output terminal 40.

The filter protecting switches 60a and 60b are connected to the corresponding ends of the filter 30. The filter protecting switches 61a and 61b are connected to the corresponding ends of the filter 31.

With this configuration, the potentials at both ends of an unselected filter can be fixed, thereby enhancing the capability to protect the unselected filter. That is, the possibility that electrostatic discharge destruction occurs in the unselected filter becomes sufficiently low, thereby making it even less likely to decrease the frequency characteristics of the filter.

Additionally, the unselected filter is even less likely to adversely influence the bandpass characteristics of a selected filter. This can further enhance the precision of a signal extracted from the coupled output terminal 40.

Paths which connect the end 21 of the sub-line 20 and the coupled output terminal 40 include multiple paths which each pass through one of the filters 30 and 31 and also include branching points leading to these multiple paths. Impedance of each of the filters 30 and 31 seen from the corresponding branching point has positive reactance.

This can offset negative reactance components of the OFF capacitance of a filter protecting switch in the OFF state, which would otherwise decrease the frequency characteristics of the filter. In this case, the OFF capacitance of the filter protecting switch in the OFF state has a certain loss, but this loss is reflected in the coupling factor of the directional coupler 1.

The directional coupler 1 according to the first embodiment includes the termination circuit 80 connected to the end 22 of the sub-line 20. The termination circuit 80 is a variable termination circuit.

The provision of the termination circuit 80 makes it possible to suitably absorb and consume an RF signal at the end 22 of the sub-line 20. For example, when traveling waves are to be extracted from the coupled output terminal 40, reflected waves can be absorbed and consumed by the termination circuit 80, thereby improving the precision of a signal to be extracted.

1-4. Modified Examples

A modified example of the first embodiment will be discussed below with reference to FIG. 3.

Figure 3:
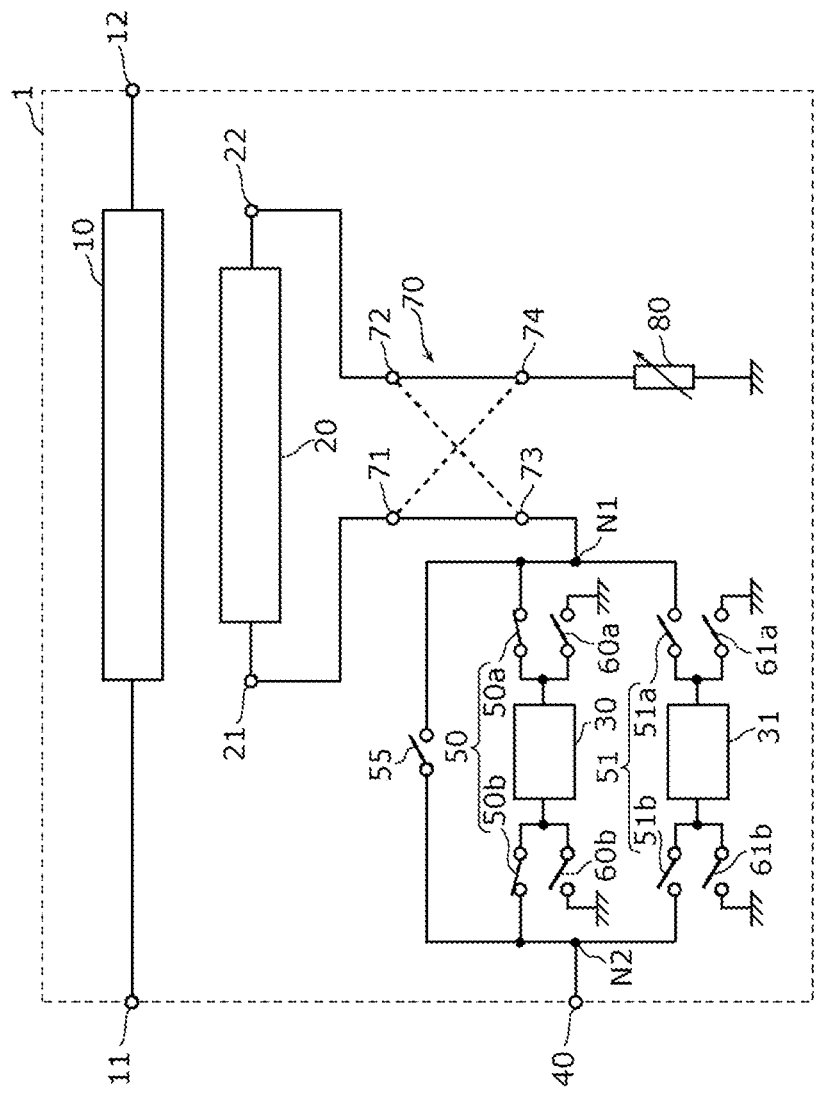
FIG. 3 illustrates another operation state of the directional coupler according to the first embodiment different from the operation state shown in FIG. 1.

FIG. 3 illustrates another operation state of the directional coupler 1 according to the modified example different from the operation state shown in FIG. 1. The configuration of the directional coupler 1 according to the modified example is the same as that of the first embodiment. Hence, the operation of the directional coupler 1 in the modified example will be explained by using the configuration of the directional coupler 1 of the first embodiment.

In the first embodiment, as a result of switching one or both of the filter protecting switches connected to an unselected filter to be ON, one or both ends of the unselected switch are connected to a reference potential. In contrast, in the modified example, the filter protecting switches 61a and 61b connected to the filter 31, which is an unselected filter, are OFF, as shown in FIG. 3. That is, one end of the filter 31, which is an unselected filter, is not fixed to the reference potential, or neither of the ends of the filter 31 is connected to the reference potential.

In the modified example, the filter protecting switches 60a, 60b, 61a, and 61b are maintained in the OFF state regardless of the ON/OFF states of the filter switching circuits 50 and 51. This will be explained more specifically. The filter protecting switches 60a, 60b, 61a, and 61b each function as a Zener diode. When a high voltage is applied to the filter protecting switch 61a, the filter protecting switch 61a enters the ON state (breakdown) to maintain the voltage across the filter protecting switch 61a to a constant value. This can maintain the potential at one end of the filter 31 connected to the filter protecting switch 61a to a constant value. In this manner, a voltage higher than the voltage of the filter protecting switch 61a is not applied to the filter 31, thereby protecting the filter 31.

As described above, in the directional coupler 1 according to the modified example, the filter protecting switches 60a, 60b, 61a, and 61b each disconnect a corresponding end of the filter 30 or 31 from the reference potential.

This can make it less likely to decrease the frequency characteristics of the filter, as in the first embodiment.

Second Embodiment

A second embodiment will be described below.

A directional coupler according to the second embodiment is different from that of the first embodiment mainly in the configurations of the filter switching circuits and the filter protecting switches. The second embodiment will be explained mainly by referring to points different from the first embodiment while omitting or simplifying an explanation of the same points.

2-1. Configuration

The configuration of a directional coupler 101 according to the second embodiment will first be described below with reference to FIG. 4.

Figure 4:
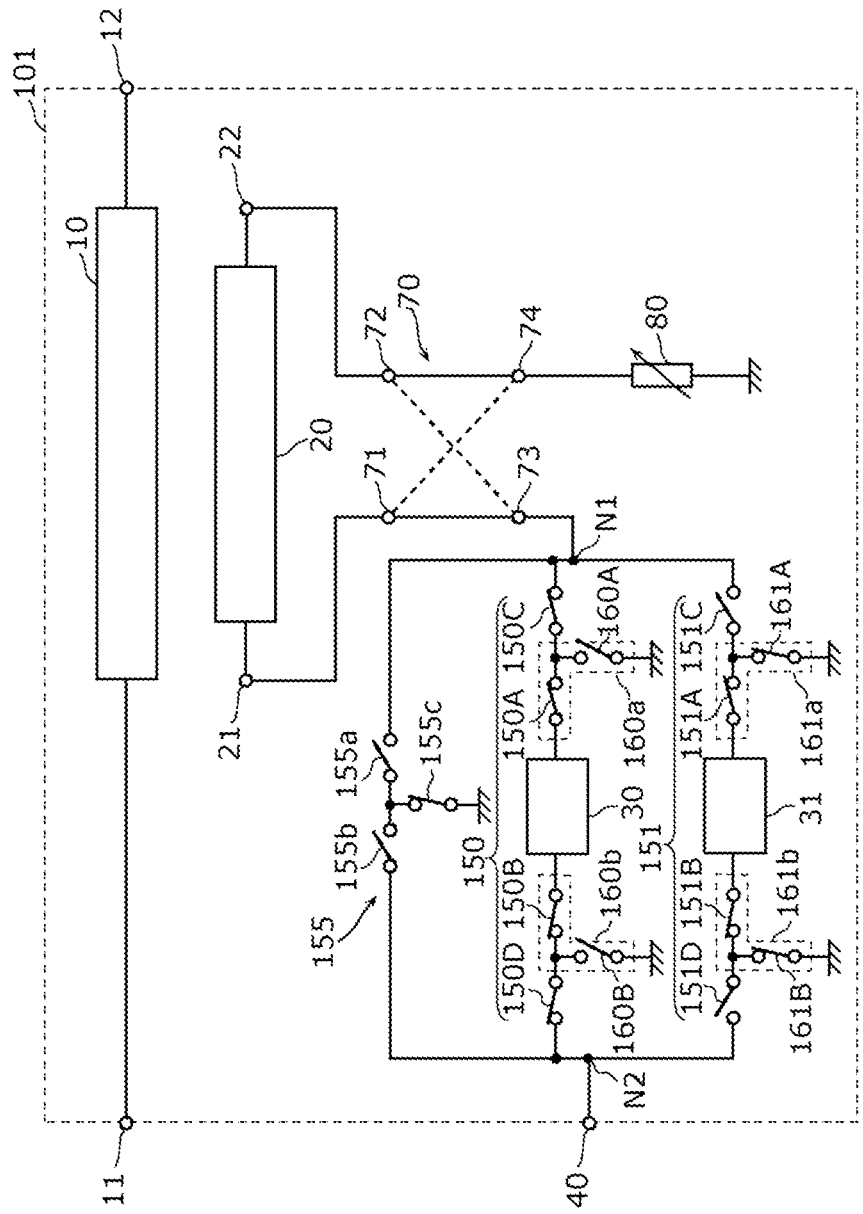
FIG. 4 illustrates the configuration of a directional coupler according to a second embodiment.

As shown in FIG. 4, in the directional coupler 101, switches disposed between the filter 30 and each of node N1 and node N2 and those between the filter 31 and each of node N1 and node N2 of the directional coupler 1 of the first embodiment are replaced by T-type switch circuits, each of which includes two series switches and one shunt switch. More specifically, the directional coupler 101 includes plural filter switching circuits (two filter switching circuits 150 and 151 in the example in FIG. 4), plural filter protecting circuits (four filter protecting circuits 160*a*, 160*b*, 161*a*, and 161*b* in the example in FIG. 4), and a bypass switch circuit 155, instead of the plural filter switching circuits 50 and 51, the plural filter protecting switches 60*a*, 60*b*, 61*a*, and 61*b*, and the bypass switch 55. In the second embodiment, as well as in the first embodiment, the devices other than the filters 30 and 31 are formed on a semiconductor IC included in the directional coupler 101. More specifically, the filter switching circuits 150 and 151, the filter protecting circuits 160*a*, 160*b*, 161*a*, and 161*b*, and the bypass switch circuit 155 are formed in or on the semiconductor IC.

The filter switching circuits 150 and 151 form a first switch circuit that can connect each of the filters 30 and 31 to the end 21 of the sub-line 20 and to the coupled output terminal 40. The filter switching circuit 150 is associated with the filter 30 and connects the filter 30 to node N1 and node N2 or disconnects the filter 30 from node N1 and node N2. The filter switching circuit 151 is associated with the filter 31 and connects the filter 31 to node N1 and node N2 or disconnects the filter 31 from node N1 and node N2.

The filter switching circuit 150 includes switches 150A, 150B, 150C, and 150D. The filter switching circuit 150 may only include the switches 150A and 150C or the switches 150B and 150D.

Each of the switches 150A and 150B is an example of a first switch that is connected to one end of the filter 30. The switch 150A is directly connected to the end of the filter 30 closer to node N1. The switch 150B is directly connected to the end of the filter 30 closer to node N2. The states of the switches 150A and 150B are controlled so that both of the switches 150A and 150B are either in the ON state together or in the OFF state together.

Each of the switches 150C and 150D is an example of a second switch that is connected in series between the first switch and the end 21 of the sub-line 20 or the coupled output terminal 40. The switch 150C is connected between the switch 150A and node N1, while the switch 150D is connected between the switch 150B and node N2. The states of the switches 150C and 150D are controlled so that both of the switches 150C and 150D are either in the ON state together or in the OFF state together.

The filter switching circuit 151 includes switches 151A, 151B, 151C, and 151D. The filter switching circuit 151 may only include the switches 151A and 151C or the switches 151B and 151D.

Each of the switches 151A and 151B is an example of a first switch that is connected to one end of the filter 31. The switch 151A is directly connected to the end of the filter 31 closer to node N1. The switch 151B is directly connected to the end of the filter 31 closer to node N2. The states of the switches 151A and 151B are controlled so that both of the switches 151A and 151B are either in the ON state together or in the OFF state together.

Each of the switches 151C and 151D is an example of a second switch that is connected in series between the first switch and the end 21 of the sub-line 20 or the coupled output terminal 40. The switch 151C is connected between the switch 151A and node N1, while the switch 151D is connected between the switch 151B and node N2. The states of the switches 151C and 151D are controlled so that both of the switches 151C and 151D are either in the ON state together or in the OFF state together.

Each of the filter protecting circuits 160*a*, 160*b*, 161*a*, and 161*b* is an example of a second switch circuit. The filter protecting circuit 160*a* is connected to one end of the filter 30 and to a reference potential. The filter protecting circuit 160*b* is connected to the other end of the filter 30 and to the reference potential. The filter protecting circuit 161*a* is connected to one end of the filter 31 and to the reference potential. The filter protecting circuit 161*b* is connected to the other end of the filter 31 and to the reference potential. The filter protecting circuits 160*a* and 160*b* can each switch between a state in which a corresponding end of the filter 30 is connected to the reference potential and a state in which the corresponding end of the filter 30 is disconnected from the reference potential. The filter protecting circuits 161*a* and 161*b* can each switch between a state in which a corresponding end of the filter 31 is connected to the reference potential and a state in which the corresponding end of the filter 31 is disconnected from the reference potential.

The filter protecting circuit 160*a* includes switches 150A and 160A. The switch 150A forms both of the filter protecting circuit 160*a* and the filter switching circuit 150. The switch 160A is an example of a third switch that can switch between a state in which a connecting portion between the switches 150A and 150C is connected to the reference potential and a state in which this connecting portion is disconnected from the reference potential. More specifically, the switch 160A is directly connected to this connecting portion and to a ground. The filter protecting circuit 160*a* switches between a state in which the end of the filter 30 closer to node N1 is connected to the ground and a state in which this end of the filter 30 is disconnected from the ground.

The filter protecting circuit 160*b* includes switches 150B and 160B. The switch 150B forms both of the filter protecting circuit 160*b* and the filter switching circuit 150. The switch 160B is an example of a third switch that can switch between a state in which a connecting portion between the switches 150B and 150D is connected to the reference potential and a state in which this connecting portion is disconnected from the reference potential. More specifically, the switch 160B is directly connected to this connecting portion and to a ground. The filter protecting circuit 160*b* switches between a state in which the end of the filter 30 closer to node N2 is connected to the ground and a state in which this end of the filter 30 is disconnected from the ground.

The filter protecting circuit 161*a* includes switches 151A and 161A. The switch 151A forms both of the filter protecting circuit 161*a* and the filter switching circuit 151. The switch 161A is an example of a third switch that can switch between a state in which a connecting portion between the switches 151A and 151C is connected to the reference potential and a state in which this connecting portion is disconnected from the reference potential. More specifically, the switch 161A is directly connected to this connecting portion and to a ground. The filter protecting circuit 161*a* switches between a state in which the end of the filter 31 closer to node N1 is connected to the ground and a state in which this end of the filter 31 is disconnected from the ground.

The filter protecting circuit 161*b* includes switches 151B and 161B. The switch 151B forms both of the filter protecting circuit 161*b* and the filter switching circuit 151. The switch 161B is an example of a third switch that can switch between a state in which a connecting portion between the switches 151B and 151D is connected to the reference potential and a state in which this connecting portion is disconnected from the reference potential. More specifically, the switch 161B is directly connected to this connecting portion and to a ground. The filter protecting circuit 161b switches between a state in which the end of the filter 31 closer to node N2 is connected to the ground and a state in which this end of the filter 31 is disconnected from the ground.

The bypass switch circuit 155 switches between a state in which a bypass path is connected to node N1 and node N2 and a state in which the bypass path is disconnected from node N1 and node N2. The bypass switch circuit 155 includes switches 155a, 155b, and 155c. The switches 155a and 155b are connected in series with each other between node N1 and node N2. The switch 155c is directly connected to a connecting portion between the switches 155a and 155b and to a ground. That is, the bypass switch circuit 155 is a T-type switch circuit.

2-2. Operation (ON/OFF States of Switches)

The operation of the directional coupler 101 according to the second embodiment will now be described below. In the following description, the ON/OFF states of the switches will mainly be discussed. The ON/OFF states of the switches are switched by a control circuit, which is not shown.

As in the first embodiment, in the directional coupler 101, to transmit a coupled signal from node N1 to node N2, the filter switching circuits 150 and 151 and the bypass switch circuit 155 are controlled so that only one path connects node N1 and node N2 or that no path connects node N1 and node N2. In the example in FIG. 4, the filter 30 is a selected filter connected between node N1 and node N2, while the filter 31 is an unselected filter.

As shown in FIG. 4, to connect the filter 30 to node N1 and node N2, the filter switching circuit 150 is turned ON. More specifically, all the switches 150A, 150B, 150C, and 150D are ON. The filter switching circuit 151 connected to the filter 31, which is an unselected filter, and the bypass switch circuit 155 are both OFF.

In the second embodiment, the filter protecting circuits 160a, 160b, 161a, and 161b are controlled in accordance with the ON/OFF states of the filter switching circuits 150 and 151. More specifically, the filter protecting circuits 160a, 160b, 161a, and 161b are each operable to disconnect one end of a selected filter from the reference potential and to connect one end of an unselected filter to the reference potential.

As shown in FIG. 4, the filter protecting circuits 160a and 160b connected to the corresponding ends of the filter 30, which is a selected filter, are OFF. More specifically, the switches 160A and 160B, which each serve as a shunt switch of a T-type switch circuit, are OFF. The switches 150A and 150B, which also form the filter switching circuit 150, are ON. With this configuration, the filter protecting circuits 160a and 160b can disconnect both ends of the filter 30 from a ground. This allows a coupled signal, which is transmitted from the main line 10 to the sub-line 20 due to electromagnetic coupling therebetween, to pass from node N1 to node N2 via the filter 30.

In contrast, the filter protecting circuits 161a and 161b connected to the corresponding ends of the filter 31, which is an unselected filter, are ON. More specifically, the switches 151A, 161A, 151B, and 161B are all ON. With this configuration, the filter protecting circuits 161a and 161b can connect both ends of the filter 31 to a ground.

To disconnect the filter 31 from node N1 and node N2, the switches 151C and 151D of the filter switching circuit 151 are turned OFF. The filter 31 can thus be disconnected from node N1 and node N2 even though the switches 151A and 151B of the filter protecting circuits 161a and 161b are ON. In the second embodiment, the switches 150A, 150B, 151A, and 151B are maintained in the ON state regardless of whether the filter connected to the switches 150A and 150B and that to the switches 151A and 151B are a selected filter or an unselected filter.

The potentials at both ends of the filter 31, which is an unselected filter through which a coupled signal does not flow, are fixed in this manner. This makes it less likely to generate a large potential difference across the filter 31 and can accordingly reduce the occurrence of electrostatic discharge destruction in the filter 31.

As in the first embodiment, in the second embodiment, the potential at only one end of an unselected filter may be fixed. This may omit the provision of one of the filter protecting circuits 160a and 160b and one of the filter protecting circuits 161a and 161b.

2-3. Advantages and Others

As described above, the directional coupler 101 according to the second embodiment includes the main line 10, the sub-line 20 electromagnetically coupled with the main line 10, the coupled output terminal 40, the plural filters 30 and 31, the filter switching circuits 150 and 151, and the plural filter protecting circuits 160a, 160b, 161a, and 161b. The filter switching circuits 150 and 151 can connect the associated filters 30 and 31 to the end 21 of the sub-line 20 and to the coupled output terminal 40. The filter protecting circuits 160a, 160b, 161a, and 161b are each connected to a corresponding end of the associated filter 30 or 31 and can each switch between a state in which the corresponding end of the associated filter 30 or 31 is connected to the reference potential and a state in which the corresponding end of the associated filter 30 or 31 is disconnected from the reference potential. When the filter switching circuit 150 or 151 connects a selected one of the filters 30 and 31 to the end 21 of the sub-line 20 and to the coupled output terminal 40, the filter protecting circuits 160a, 160b, 161a, and 161b are operable to disconnect a corresponding end of the selected filter from the reference potential and to connect a corresponding end of a filter other than the selected filter to the reference potential.

With this configuration, as in the first embodiment, the potential at least at one end of an unselected filter can be fixed to the reference potential. This can reduce the occurrence of electrostatic discharge destruction in the unselected filter and thus makes it less likely to decrease the frequency characteristics of the filter. Additionally, the unselected filter is less likely to adversely influence the bandpass characteristics of a selected filter. This can enhance the precision of a signal extracted from the coupled output terminal 40.

The filter switching circuit 150 includes a first switch connected to one end of the filter 30 and a second switch connected in series between the first switch and the end 21 of the sub-line 20 or the coupled output terminal 40. The filter switching circuit 151 includes a first switch connected to one end of the filter 31 and a second switch connected in series between the first switch and the end 21 of the sub-line 20 or the coupled output terminal 40. The filter protecting circuits 160a, 160b, 161a, and 161b each include the first switch and a third switch. The third switch can switch between a state in which a connecting portion between the first switch and the second switch is connected to the reference potential and a state in which this connecting portion is disconnected from the reference potential. When the filter switching circuit 150 or 151 connects a selected filter to the end 21 of the sub-line 20 and to the coupled output terminal 40, the first and third switches of the filter protecting circuits 160a and 160b or those of the filter protecting circuits 161a and 161b connected to one end of a filter other than the selected filter connect one end of this filter other than the selected filter to the reference potential.

This makes it possible to switch between the filters and also to protect an unselected filter.

The filter protecting circuits 160a and 160b are connected to the corresponding ends of the filter 30. The filter protecting circuits 161a and 161b are connected to the corresponding ends of the filter 31.

This can reduce the possibility that electrostatic discharge destruction occurs in an unselected filter to be sufficiently low, thereby making it even less likely to decrease the frequency characteristics of the filter. Additionally, the unselected filter is even less likely to adversely influence the bandpass characteristics of a selected filter. This can further enhance the precision of a signal extracted from the coupled output terminal 40.

Third Embodiment

A third embodiment will be described below.

A directional coupler according to the third embodiment is different from those of the first and second embodiments mainly in that multiple main lines and multiple sub-lines are provided. The third embodiment will be explained mainly by referring to points different from the first and second embodiments while omitting or simplifying an explanation of the same points.

3-1. Configuration

The configuration of a directional coupler 201 according to the third embodiment will first be described below with reference to FIG. 5.

Figure 5:
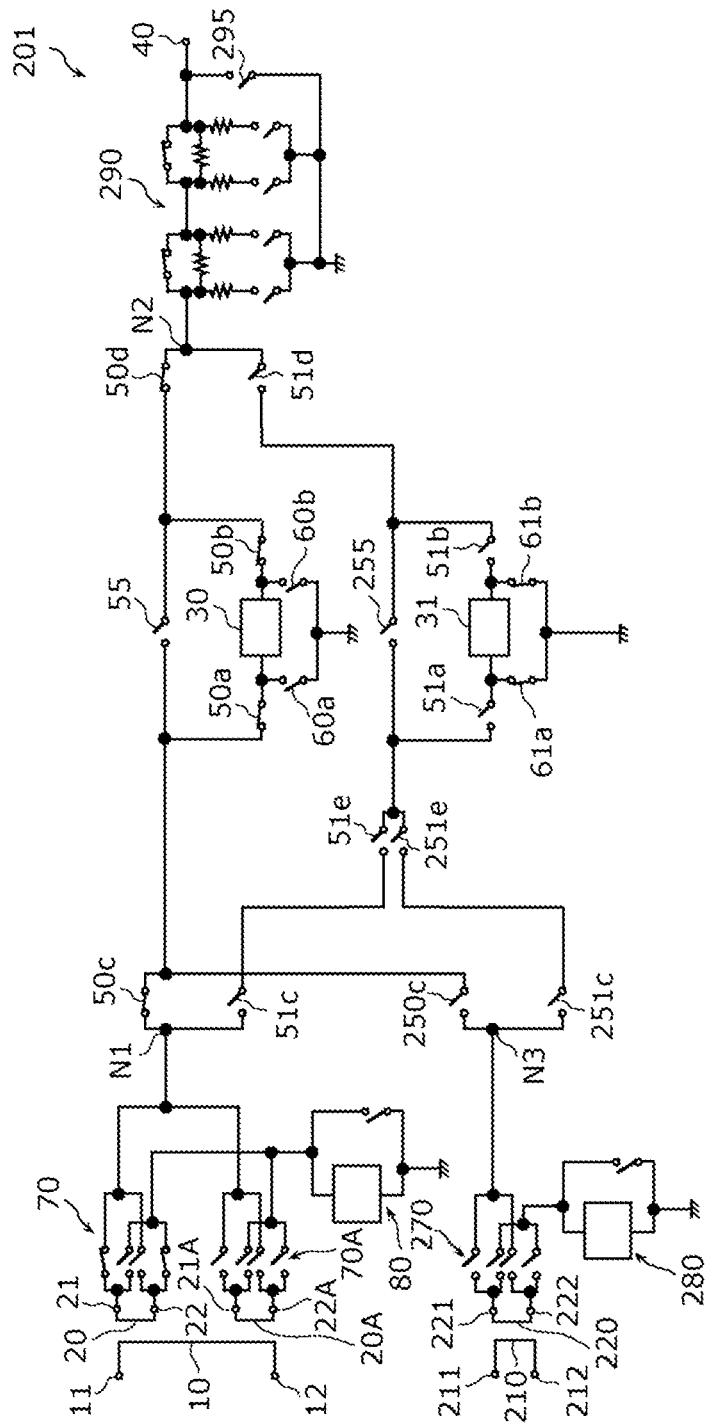
FIG. 5 illustrates the configuration of a directional coupler according to a third embodiment.

As shown in FIG. 5, the directional coupler 201 includes two main lines 10 and 210, three sub-lines 20, 20A, and 220, two filters 30 and 31, and a coupled output terminal 40. The directional coupler 201 also includes plural switches 50a through 50d, 51a through 51e, 250c, 251c, and 251e, filter protecting switches 60a, 60b, 61a, and 61b, bypass switches 55 and 255, direction switching circuits 70, 70A, and 270, and termination circuits 80 and 280. The directional coupler 201 also includes a variable attenuator 290 and a terminal protecting switch 295.

In the third embodiment, the main line 10 is electromagnetically coupled with the two sub-lines 20 and 20A. Part of an RF signal transmitted through the main line 10 flows into the sub-lines 20 and 20A as a coupled signal.

The sub-line 20A has two ends 21A and 22A. Each of the two ends 21A and 22A is selectively connected to one of the coupled output terminal 40 and the termination circuit 80 via the direction switching circuit 70A. The length of the sub-line 20A is different from that of the sub-line 20.

The main line 210 has two input/output terminals 211 and 212. The input/output terminal 211 is connected to at least one of a transmit circuit and a receive circuit. The input/output terminal 212 is connected to an antenna. The input/output terminal 211 may be connected to the antenna, while the input/output terminal 212 may be connected to the transmit circuit or the receive circuit.

The transmit circuit or the receive circuit to which the main line 10 is connected may be the same as or different from the transmit circuit or the receive circuit to which the main line 210 is connected. Likewise, the antenna to which the main line 10 is connected may be the same as or different from the antenna to which the main line 210 is connected.

The main line 210 is electromagnetically coupled with the sub-line 220. Part of an RF signal transmitted through the main line 210 flows into the sub-line 220 as a coupled signal.

The sub-line 220 has two ends 221 and 222. Each of the two ends 221 and 222 is selectively connected to one of the coupled output terminal 40 and the termination circuit 280 via the direction switching circuit 270.

The configurations of the direction switching circuits 70A and 270 are the same as that of the direction switching circuit 70 in the first embodiment. The direction switching circuit 70 can connect one end of the sub-line 20 to the coupled output terminal 40 and the other end to the termination circuit 80. The direction switching circuit 70A can connect one end of the sub-line 20A to the coupled output terminal 40 and the other end to the termination circuit 80. The direction switching circuit 270 can connect one end of the sub-line 220 to the coupled output terminal 40 and the other end to the termination circuit 280. Only one of the three sub-lines 20, 20A, and 220 can be connected to the coupled output terminal 40 and the transmission circuit 80 or 280 at the same time. In the example shown in FIG. 5, the direction switching circuit 70 connects the end 21 of the sub-line 20 to the coupled output terminal 40 and the end 22 to the termination circuit 80. Meanwhile, the direction switching circuits 70A and 270 disconnect the two ends of the sub-lines 20A and 220, respectively, from the coupled output terminal 40 and the termination circuits 80 and 280, respectively. Hence, coupled signals flowing through the sub-lines 20A and 220 are less likely to be mixed into the coupled output terminal 40. At least one of the direction switching circuits 70, 70A, and 270 may be omitted. A switch may be provided to select one of the three sub-lines 20, 20A, and 220 and connect one end of the selected sub-line to the coupled output terminal 40.

The plural switches 50a through 50d, 51a through 51e, 250c, 251c, and 251e and the bypass switches 55 and 255 select one of the multiple paths between node N1 and node N2 and those between node N3 and node N2 and connect the selected path between the corresponding nodes. Node N1 is associated with the main line 10, and one of the ends 21 and 22 of the sub-line 20 and the ends 21A and 22A of the sub-line 20A is connected to node N1 by the direction switching circuit 70 or 70A. Node N3 is associated with the main line 210, and one of the ends 221 and 222 of the sub-line 220 is connected to node N3 by the direction switching circuit 270.

The switch 50c is connected to node N1 and to the switch 50a. The switch 50d is connected to node N2 and to the switch 50b.

The bypass switch 55 is connected between the switches 50c and 50d. A series circuit of the switch 50a, the filter 30, and the switch 50b is connected between the two ends of the bypass switch 55. That is, the bypass switch 55 can select whether to allow a signal to be transmitted through a bypass path which does not pass through the filter 30.

The switch 51c is connected between node N1 and the switch 51a via the switch 51e. The switch 51d is connected to the switch 51b and node N2. The switch 51e is connected to the switches 51c and 51a.

The bypass switch 255 is connected between the switches 51e and 51d. A series circuit of the switch 51a, the filter 31, and the switch 51b is connected between the two ends of the bypass switch 255. That is, the bypass switch 255 can select whether to allow a signal to be transmitted through a bypass path which does not pass through the filter 31. At least one of the bypass switches 55 and 255 may be omitted.

The switch 250c is connected to node N3 and the switch 50a. The switch 251c is connected between node N3 and the switch 51a via the switch 251e. The switch 251e is connected to the switches 251c and 51a.

The variable attenuator 290 is disposed on a path connecting the coupled output terminal 40 and one end of the sub-line 20, 20A, or 220. More specifically, the variable attenuator 290 is connected to node N2 and the coupled output terminal 40.

The variable attenuator 290 is a circuit that changes the output level of a signal to be outputted from the coupled output terminal 40. In the example in FIG. 5, the variable attenuator 290 includes six resistors and six switches, but the circuit configuration is not limited to a particular configuration. The switches 51e and 251e may be omitted.

The terminal protecting switch 295 is a switch that can switch between a state in which the coupled output terminal 40 is connected to a reference potential and a state in which the coupled output terminal 40 is disconnected from the reference potential. The terminal protecting switch 295 is directly connected to the coupled output terminal 40 and to a ground.

The terminal protecting switch 295 is normally maintained in the OFF state. That is, the terminal protecting switch 295 normally disconnects the coupled output terminal 40 from a ground. This will be explained more specifically. The terminal protecting switch 295 functions as a Zener diode. When a high voltage is applied to the coupled output terminal 40, the terminal protecting switch 295 enters the ON state to maintain the voltage across the terminal protecting switch 295 to a constant value. This can maintain the potential of the coupled output terminal 40 connected to the terminal protecting switch 295 to a constant value. In this manner, a voltage higher than the voltage of the terminal protecting switch 295 is not applied to the coupled output terminal 40, thereby protecting the coupled output terminal 40.

The number, positions, and connection state of the switches shown in FIG. 5 are only examples and may be changed appropriately if the connection state of plural sub-lines and plural filters is variable.

A matching circuit may be disposed between node N1 or node N3 and the coupled output terminal 40. A matching circuit includes at least one capacitor and at least one inductor.

The directional coupler 201 may include three or more main lines. Additionally, three or more sub-lines may be electromagnetically coupled with one main line.

3-2. Operation (ON/OFF States of Switches)

The operation of the directional coupler 201 according to the third embodiment will now be described below. In the following description, the ON/OFF states of the switches will mainly be discussed. The ON/OFF states of the switches are switched by a control circuit, which is not shown.

In the directional coupler 201, part of an RF signal transmitted through the main line 10 flows into the sub-line 20 or 20A as a coupled signal due to electromagnetic coupling between the main line 10 and the sub-line 20 or 20A. The coupled signal flows from the end of the sub-line 20 or 20A until node N1 via the direction switching circuit 70 or 70A. The coupled signal having reached node N1 passes through a selected one of the filters 30 and 31 or the bypass switch 55 or 255 and further passes through node N2 and is then outputted from the coupled output terminal 40.

Part of an RF signal transmitted through the main line 210 flows into the sub-line 220 as a coupled signal due to electromagnetic coupling between the main line 210 and the sub-line 220. The coupled signal flows from the end of the sub-line 220 until node N3 via the direction switching circuit 270. The coupled signal having reached node N3 passes through a selected one of the filters 30 and 31 or the bypass switch 55 or 255 and further passes through node N2 and is then outputted from the coupled output terminal 40.

In the third embodiment, the switches 50c, 51c, and 51e and the switches 250c, 251c, and 251e are used for selecting one of the main lines 10 and 210. To select the main line 10, that is, to output from the coupled output terminal 40 a coupled signal flowing from the main line 10 to the sub-line 20 or 20A due to electromagnetic coupling between the main line 10 and the sub-line 20 or 20A, the switch 50c or the switches 51c and 51e are turned ON. Then, the coupled signal from node N1 reaches node N2 via one of the filters 30 and 31 or the bypass switch 55 or 255 and is outputted from the coupled output terminal 40 via the variable attenuator 290.

To select the main line 210, that is, to output from the coupled output terminal 40 a coupled signal flowing from the main line 210 to the sub-line 220 due to electromagnetic coupling between the main line 210 and the sub-line 220, the switch 250c or the switches 251c and 251e are turned ON. Then, the coupled signal from node N3 reaches node N2 via one of the filters 30 and 31 or the bypass switch 55 or 255 and is outputted from the coupled output terminal 40 via the variable attenuator 290.

In the third embodiment, switches other than those used for connecting a path between node N1 or node N3 and node N2 are OFF. In the example in FIG. 5, the filter 30 is a selected filter, and the path from node N1 to node N2 via the filter 30 is selected. Accordingly, the switches 50c, 50a, 50b, and 50d disposed on the path passing through the filter 30 are ON. The switches 51a through 51e, 250c, 251c, and 251e and the bypass switches 55 and 255 disposed on paths other than the path passing through the filter 30 are all OFF.

As in the first embodiment, in the third embodiment, the filter protecting switches 60a, 60b, 61a, and 61b are OFF when they are connected to a selected filter and are ON when they are connected to an unselected filter. In the example in FIG. 5, the filter protecting switches 60a and 60b connected to the filter 30, which is a selected filter, are OFF, while the filter protecting switches 61a and 61b connected to the filter 31, which is an unselected filter, are ON. This can fix the potentials at both ends of the filter 31 to a ground, and the occurrence of electrostatic discharge destruction in the filter 31 can thus be reduced.

3-3. Advantages and Others

As described above, the directional coupler 201 according to the third embodiment includes the variable attenuator 290 disposed on a path connecting the coupled output terminal 40 and the end 21 of the sub-line 20.

Because of the provision of the variable attenuator 290, the level of a coupled output signal can be adjusted. It is thus possible to output from the coupled output terminal 40 a signal of an output level that can be highly precisely detected by a detector connected to the coupled output terminal 40.

The directional coupler 201 also includes the terminal protecting switch 295 that can switch between a state in which the coupled output terminal 40 is connected to the reference potential and a state in which the coupled output terminal 40 is disconnected from the reference potential.

The terminal protecting switch 295 can protect elements such as the filters 30 and 31 and the variable attenuator 290 from an unwanted high voltage signal entering from the coupled output terminal 40, for example.

The directional coupler 201 includes the multiple sub-lines 20, 20A, and 220. The directional coupler 201 also includes switches that can switch between paths connecting the corresponding ends of the sub-lines 20, 20A, and 220 and the coupled output terminal 40.

The provision of multiple sub-lines makes it possible to select a signal from a wider frequency range or spectrum and to output the selected signal.

The directional coupler 201 includes the multiple main lines 10 and 210. Each of the multiple sub-lines 20, 20A, and 220 is electromagnetically coupled with one of the main lines 10 and 210.

The provision of plural main lines makes it possible to select a signal from a wider frequency range or spectrum and to output the selected signal.

Others

The directional couplers according to the above-described embodiments of the disclosure have been discussed. However, the disclosure is not restricted to the above-described embodiments.

For example, at least one of the filters 30 and 31 may be a tunable filter. That is, the frequency characteristics, such as the pass band, of at least one of the filters 30 and 31 may be adjustable. A switch or a varactor, for example, is used for tuning the filters 30 and 31, or another element may be used.

Embodiments obtained by making various modifications to the above-described embodiments by those skilled in the art and embodiments achieved by combining elements and functions of the above-described embodiments without departing from the scope and spirit of the disclosure are also encompassed in the disclosure.

The present disclosure is applicable to devices such as electronic devices and communication devices including a directional coupler. While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A directional coupler comprising:
a main line;
a sub-line electromagnetically coupled with the main line;
an output terminal;
a plurality of filters;
a switch circuit configured to selectively connect each of the plurality of filters to a first end of the sub-line and to the output terminal; and
a plurality of switches that are each directly connected to a corresponding end of a corresponding one of the plurality of filters, and that are each configured to selectively connect the corresponding end of the corresponding one of the plurality of filters directly to a reference potential.

2. The directional coupler according to claim 1, wherein, when the switch circuit connects a selected one of the plurality of filters to the first end of the sub-line and to the output terminal, the switches corresponding to the selected filter are configured to disconnect the corresponding ends of the selected filter from the reference potential, and the switches corresponding to a filter other than the selected filter are configured to connect the corresponding ends of the filter other than the selected filter to the reference potential.

3. The directional coupler according to claim 1, wherein the plurality of switches each disconnect the corresponding ends of the corresponding plurality of filters from the reference potential.

4. The directional coupler according to claim 1, further comprising:
a semiconductor integrated circuit; and
at least one external device connected to the semiconductor integrated circuit, wherein:
the main line, the sub-line, the switch circuit, and the plurality of switches are in or on the semiconductor integrated circuit, and
the at least one external device comprises the plurality of filters.

5. The directional coupler according to claim 1, wherein:
connection pathways between the first end of the sub-line and the output terminal comprise a plurality of paths that each pass through one of the plurality of filters, and branching points leading to the plurality of paths; and
an impedance of each of the plurality of filters as seen from a corresponding branching point has a positive reactance.

6. The directional coupler according to claim 1, further comprising:
a termination circuit connected to a second end of the sub-line.

7. The directional coupler according to claim 1, further comprising:
a variable attenuator on a path connecting the output terminal and the first end of the sub-line.

8. The directional coupler according to claim 1, further comprising:
a switch configured to selectively connect the output terminal to the reference potential.

9. The directional coupler according to claim 1, further comprising:
a plurality of the sub-lines; and
a switch configured to selectively connect each of the plurality of sub-lines to the output terminal.

10. The directional coupler according to claim 9, further comprising:
a plurality of the main lines,
wherein each of the plurality of the sub-lines is electromagnetically coupled with one of the plurality of the main lines.

11. A directional coupler comprising:
a main line;
a sub-line electromagnetically coupled with the main line;
an output terminal;
a plurality of filters;
a first switch circuit configured to selectively connect each of the plurality of filters to a first end of the sub-line and to the output terminal; and
a plurality of second switch circuits that are each connected to a corresponding end of a corresponding one of the plurality of filters, and that are each configured to selectively connect the corresponding end of the corresponding one of the plurality of filters directly to a reference potential, wherein, when the first switch circuit connects a selected one of the plurality of filters to the first end of the sub-line and to the output terminal, the second switch circuits corresponding to the selected filter are configured to disconnect the corresponding ends of the selected filter from the reference potential, and the second switch circuits corresponding to a filter other than the selected filter are configured to connect the corresponding ends of the filter other than the selected filter to the reference potential.

12. The directional coupler according to claim 11, wherein:
the first switch circuit comprises:
a first switch connected to a first end of each of the plurality of filters, and
a second switch connected in series between the first switch and the first end of the sub-line or the output terminal;
the plurality of second switch circuits each comprise:
the first switch, and
a third switch that is configured to selectively connect a node between the first switch and the second switch to the reference potential; and
when the first switch circuit connects the selected filter to the first end of the sub-line and to the output terminal, the first and third switches of the second switch circuit connected to a first end of the filter other than the selected filter are configured to selectively connect the first end of the filter other than the selected filter to the reference potential.

13. The directional coupler according to claim 11, further comprising:
a semiconductor integrated circuit; and
at least one external device connected to the semiconductor integrated circuit, wherein:
the main line, the sub-line, the first switch circuit, and the plurality of second switch circuits are in or on the semiconductor integrated circuit, and
the at least one external device comprises the plurality of filters.

14. The directional coupler according to claim 11, wherein:
connection pathways between the first end of the sub-line and the output terminal comprise a plurality of paths that each pass through one of the plurality of filters, and branching points leading to the plurality of paths; and
an impedance of each of the plurality of filters as seen from a corresponding branching point has a positive reactance.

15. The directional coupler according to claim 11, further comprising:
a termination circuit connected to a second end of the sub-line.

16. The directional coupler according to claim 11, further comprising:
a variable attenuator on a path connecting the output terminal and the first end of the sub-line.

17. The directional coupler according to claim 11, further comprising:
a switch configured to selectively connect the output terminal to the reference potential.

18. The directional coupler according to claim 11, further comprising:
a plurality of the sub-lines; and
a switch configured to selectively connect each of the plurality of sub-lines to the output terminal.

19. The directional coupler according to claim 18, further comprising:
a plurality of the main lines,
wherein each of the plurality of the sub-lines is electromagnetically coupled with one of the plurality of the main lines.

* * * * *